(12) United States Patent
Cook et al.

(10) Patent No.: US 11,120,965 B2
(45) Date of Patent: Sep. 14, 2021

(54) BEAM BLANKING DEVICE FOR A MULTI-BEAMLET CHARGED PARTICLE BEAM APPARATUS

(71) Applicant: ICT Integrated Circuit Testing Gesellschaft für Halbleiterprüftechnik mbH, Heimstetten (DE)

(72) Inventors: Benjamin John Cook, Munich (DE); Eoin Horgan, Limerick (IE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 77 days.

(21) Appl. No.: 16/703,478

(22) Filed: Dec. 4, 2019

(65) Prior Publication Data

US 2021/0175046 A1 Jun. 10, 2021

(51) Int. Cl.
*H01J 37/00* (2006.01)
*H01J 37/04* (2006.01)
(Continued)

(52) U.S. Cl.
CPC .......... *H01J 37/045* (2013.01); *H01J 37/147* (2013.01); *H01J 37/244* (2013.01); *H01J 2237/043* (2013.01)

(58) Field of Classification Search
CPC ...... H01J 37/045; H01J 37/147; H01J 37/244; H01J 2237/043
(Continued)

(56) References Cited

U.S. PATENT DOCUMENTS

| 2012/0091358 A1* | 4/2012 | Wieland | B82Y 10/00 250/396 R |
| 2014/0231668 A1* | 8/2014 | Yasuda | H01J 37/045 250/396 R |
| 2017/0229285 A1* | 8/2017 | Hamaguchi | H01J 37/065 |

FOREIGN PATENT DOCUMENTS

| EP | 2 494 579 A1 | 9/2012 |
| WO | 2015/090378 A1 | 6/2015 |

OTHER PUBLICATIONS

Invitation to Pay Additional Fees for Application No. PCT/EP2020/083036, dated Feb. 16, 2021, 19 pages.
(Continued)

*Primary Examiner* — Michael Maskell
(74) *Attorney, Agent, or Firm* — Kilpatrick Townsend & Stockton LLP

(57) ABSTRACT

A beam blanking device for a multi-beamlet charged particle beam apparatus is provided. The beam blanking device includes a first blanking unit, a second blanking unit and a third blanking unit. The first blanking unit includes a first blanking electrode and a first aperture. The second blanking unit includes a second blanking electrode and a second aperture. The third blanking unit includes a third blanking electrode and a third aperture. The beam blanking device includes a common electrode forming a first counter electrode for the first blanking electrode, a second counter electrode for the second blanking electrode and a third counter electrode for the third blanking electrode. The first blanking unit, the second blanking unit and the third blanking unit are arranged in a planar array and define a plane of the planar array. The first blanking electrode is arranged for generating a first electric field between the first blanking electrode and the common electrode in the first aperture for deflecting a first beamlet of the multi-beamlet charged particle beam apparatus into a first deflection direction. The second blanking electrode is arranged for generating a second electric field between the second blanking electrode and the common electrode in the second aperture for deflecting a second beamlet of the multi-beamlet charged particle beam apparatus into a second deflection direction. The third blanking electrode is arranged for generating a third electric field between the third blanking electrode and the common electrode in the third aperture for deflecting a third beamlet of the multi-beamlet charged particle beam apparatus into a (Continued)

third deflection direction. A dividing plane intersecting the planar array separates the first blanking unit from the second blanking unit and the third blanking unit, wherein the first deflection direction, the second deflection direction and the third deflection direction point away from the dividing plane.

20 Claims, 7 Drawing Sheets

(51) Int. Cl.
  *H01J 37/147* (2006.01)
  *H01J 37/244* (2006.01)
(58) Field of Classification Search
  USPC .............................. 250/396 R, 492.1–492.3
  See application file for complete search history.

(56) References Cited

OTHER PUBLICATIONS

International Application No. PCT/EP2020/083036, International Search Report and The Written Opinion of The International Searching Authority dated Apr. 8, 2021, 7 pages.
International Application No. PCT/EP2020/083036, Written Opinion of The International Searching Authority dated Apr. 8, 2021, 18 pages.

* cited by examiner

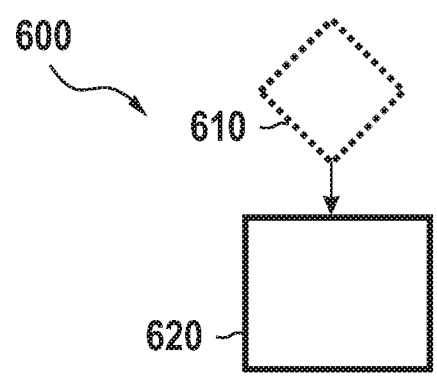

US 11,120,965 B2

BEAM BLANKING DEVICE FOR A MULTI-BEAMLET CHARGED PARTICLE BEAM APPARATUS

FIELD

The present disclosure relates to the field of charged particle beam apparatuses, for instance electron beam apparatuses. Embodiments relate to beam blanking devices for such charged particle beam apparatuses, and to methods of operating the beam blanking devices. More specifically, beam blanking devices for blanking beamlets of a multi-beamlet charged particle beam apparatus and corresponding methods of operation are provided.

BACKGROUND

For analyzing samples, e.g., to detect defects on a wafer and the like, a charged particle beam apparatus can be used, such as an electron beam apparatus for electron beam inspection (EBI). To decrease the time needed for analyzing a sample, multiple beams/beamlets may be employed to examine different parts of the sample simultaneously. Advantages can be obtained if such beams/beamlets can be blanked, and a beam blanking device for a multi-beamlet charged particle apparatus may be used for this purpose. Such blanking of certain beams/beamlets can influence the other beams/beamlets, a phenomenon known as cross-talk. Cross-talk can lead to the situation that non-blanked beams/beamlets are deflected although the non-blanked beams/beamlets should not be deflected. Cross-talk can deteriorate the result of the analysis of the sample. The problem of cross-talk becomes even more pronounced when the beam blanking devices become smaller, and with the beam blanking devices also the distance between the beams/beamlets ("pitch"). For instance, there is a demand that a deflection of 10 mrad is achieved for blanking a beam/beamlet, e.g., an electron beam with 30 kV electrons, while the beam shift of all other beams/beamlets at the wafer shall be no more than 0.1 nm, wherein the beam size on the wafer shall be smaller than 10 nm and the beam blanking device may be, e.g., about 120 mm away from the wafer. This is a very strict requirement for how low cross-talk shall be.

There is therefore a need for improved beam blanking devices having, inter alia, small cross-talk.

SUMMARY

According to an embodiment, a beam blanking device for a multi-beamlet charged particle beam apparatus is provided. The beam blanking device includes a first blanking unit, a second blanking unit and a third blanking unit. The first blanking unit includes a first blanking electrode and a first aperture. The second blanking unit includes a second blanking electrode and a second aperture. The third blanking unit includes a third blanking electrode and a third aperture. The beam blanking device includes a common electrode forming a first counter electrode for the first blanking electrode, a second counter electrode for the second blanking electrode and a third counter electrode for the third blanking electrode. The first blanking unit, the second blanking unit and the third blanking unit are arranged in a planar array and define a plane of the planar array. The first blanking unit is arranged for generating a first electric field between the first blanking electrode and the common electrode in the first aperture for deflecting a first beamlet of the multi-beamlet charged particle beam apparatus into a first deflection direction. The second blanking electrode is arranged for generating a second electric field between the second blanking electrode and the common electrode in the second aperture for deflecting a second beamlet of the multi-beamlet charged particle beam apparatus into a second deflection direction. The third blanking electrode is arranged for generating a third electric field between the third blanking electrode and the common electrode in the third aperture for deflecting a third beamlet of the multi-beamlet charged particle beam apparatus into a third deflection direction. A dividing plane intersecting the planar array separates the first blanking unit from the second blanking unit and the third blanking unit, wherein the first deflection direction, the second deflection direction and the third deflection direction point away from the dividing plane. Alternatively, or additionally, the first deflection direction, the second deflection direction and the third deflection direction point away from a dividing line intersecting the planar array.

According to another embodiment, a beam blanking device for a multi-beamlet charged particle beam apparatus is provided. The beam blanking device includes a first blanking unit, a second blanking unit and a third blanking unit. The first blanking unit includes a first blanking electrode and a first aperture. The second blanking unit includes a second blanking electrode and a second aperture. The third blanking unit includes a third blanking electrode and a third aperture. The beam blanking device includes a common electrode forming a first counter electrode for the first blanking electrode, a second counter electrode for the second blanking electrode and a third counter electrode for the third blanking electrode. The first blanking unit, the second blanking unit and the third blanking unit are arranged in a planar array and define a plane of the planar array. A dividing plane intersecting the planar array perpendicularly to the plane of the planar array separates the first blanking unit from the second blanking unit and the third blanking unit. A first line from a center of the first blanking electrode through a center of the first aperture, a second line from a center of the second blanking electrode through a center of the second aperture and a third line from a center of the third blanking electrode through a center of the third aperture either point away from the dividing plane or point toward the dividing plane.

According to another embodiment, a method of operating a beam blanking device of a multi-beamlet charged particle beam apparatus is provided. The beam blanking device includes blanking units that share a common electrode and that are arranged in a planar array and define a plane of the planar array. The method includes deflecting, with each of the blanking units, a beamlet of the multi-beamlet charged particle beam apparatus away from a dividing plane that intersects the planar array and that separates the blanking units into a first group and into a second group.

Further advantages, features, aspects and details that can be combined with embodiments described herein are evident from the dependent claims, the description and the drawings.

BRIEF DESCRIPTION OF THE FIGURES

More details will be described in the following, partly with reference to the figures, wherein:

FIG. 13 schematically illustrates a method of operating a beam blanking device of a multi-beamlet charged particle beam apparatus according to embodiments described herein.

DETAILED DESCRIPTION

Figure 1:
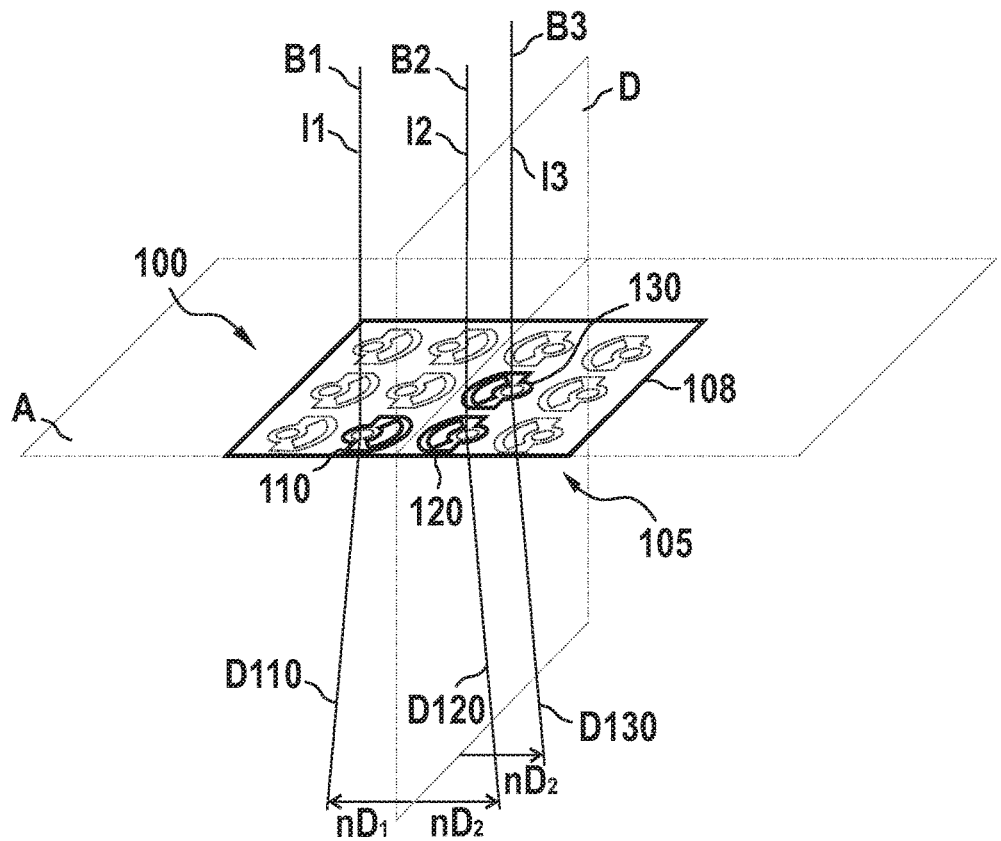
FIG. 1 shows a beam blanking device in accordance with embodiments described herein.

In the following, embodiments are described. Embodiments and parts thereof can be combined in any manner. For example, any aspect of an embodiment described herein can be combined with any other aspect of any other embodiment to form further embodiments. The detailed description of embodiments is provided for illustration. The figures need not be true to scale or angle, and may exaggerate parts for illustration. The same or like parts may have the same reference sign in the figures, and only the differences between figures will be described in principle.

According to an embodiment, a beam blanking device for a multi-beamlet charged particle beam apparatus is provided. The term "multi-beamlet" as used herein includes the cases of multiple beams stemming from separate charged particle beam sources as well as multiple beams stemming from a single charged particle beam source, e.g., beamlets formed by an aperture plate illuminated by the single charged particle beam source. The beam blanking device may be configured to blank individual beamlets of the multi-beamlet charged particle beam apparatus, independently of other beamlets, and/or may be configured to blank groups of beamlets, independently of other groups of beamlets. The groups may be rows or columns of an array of beamlets. The charged particle beam apparatus may be an electron beam apparatus. The charged particle beam apparatus may be configured for inspection of a sample. The charged particle beam apparatus may be an electron beam apparatus for electron beam inspection (EBI) of a sample, such as a wafer.

The beam blanking device includes a first blanking unit, a second blanking unit and a third blanking unit. The first blanking unit may be configured to blank a first beamlet of the multi-beamlet charged particle beam apparatus. The second blanking unit may be configured to blank a second beamlet of the multi-beamlet charged particle beam apparatus. The third blanking unit may be configured to blank a third beamlet of the multi-beamlet charged particle beam apparatus. The first blanking unit, the second blanking unit and the third blanking unit are arranged in a planar array. The first blanking unit, the second blanking unit and the third blanking unit define a plane of the planar array, with the first blanking unit, the second blanking unit and the third blanking unit not being arranged in a straight line. The beam blanking device may have N blanking units, wherein the beam blanking device may have N-3 further blanking units besides the first blanking unit, the second blanking unit and the third blanking unit. The N-3 further blanking units may be arranged in the planar array. The number N of blanking units may be $\geq 3$, $\geq 4$, $\geq 6$, $\geq 9$, $\geq 12$, $\geq 16$, $\geq 36$ or $\geq 100$. The number N of blanking units may be $\leq 1000$, $\leq 500$, $\leq 200$ or $\leq 100$. The number N of blanking units may be within ranges formed from these lower and upper bounds. The planar array may include m rows of blanking units, and n columns of blanking units. Therein, N may be equal to m times n. The planar array may be a regular lattice. The planar array may be a square lattice of blanking units. Alternatively, the planar array may be a triangular lattice or hexagonal lattice of blanking units, or may include blanking units arranged in other regular geometries, e.g., on concentric circles.

The first blanking unit includes a first blanking electrode and a first aperture. The second blanking unit includes a second blanking electrode and a second aperture. The third blanking unit includes a third blanking electrode and a third aperture. The beam blanking device includes a common electrode forming a first counter electrode for the first blanking electrode, a second counter electrode for the second blanking electrode and a third counter electrode for the third blanking electrode. The N-3 further blanking units may include respective $4^{th}$ to $N^{th}$ blanking electrodes and $4^{th}$ to $N^{th}$ apertures. The common electrode may form a counter electrode for the $4^{th}$ to $N^{th}$ blanking electrodes of the N-3 further blanking units. The common electrode may be in the plane of the planar array. The common electrode may define the plane of the planar array. Each of the apertures of the blanking units may allow one of the beamlets of the multi-beamlet charged particle device to pass through the beam blanking device. Each of the blanking units, in conjunction with the common electrode, may be configured to deflect one of the beamlets of the multi-beamlet charged particle beam apparatus.

The first aperture may define a first optical axis of the first blanking unit. The first optical axis may be a center line of the first aperture, and may be a line of symmetry of the first aperture. The second aperture may define a second optical axis of the second blanking unit. The second optical axis may be a center line of the second aperture, and may be a line of symmetry of the second aperture. The third aperture may define a third optical axis of the third blanking unit. The third optical axis may be a center line of the third aperture, and may be a line of symmetry of the third aperture. The first optical axis may be parallel to the second optical axis and/or to the third optical axis. The second optical axis may be parallel to the third optical axis. The optical axes defined by the apertures of the blanking units of the beam blanking device may be parallel to each other. In this case, when all the optical axes of the blanking units are parallel to each other, the beam blanking device or the planar array is said to have an optical axis. The first optical axis may be perpendicular to the plane of the planar array. The second optical axis may be perpendicular to the plane of the planar array. The third optical axis may be perpendicular to the plane of the planar array. The $k^{th}$ optical axis defined by the $k^{th}$ aperture of the $k^{th}$ blanking unit may be perpendicular to the plane of the planar array, and may be parallel to an $l^{th}$ optical axis defined by the $l^{th}$ aperture of the $l^{th}$ blanking unit, wherein k is in the range from 4-N and l is in the range from 1-N. A first beamlet, a second beamlet, and a third beamlet, and any of other beamlets of the multi-beamlet charged particle beam apparatus, may be incident on the beam blanking device with incoming directions parallel to the optical axes of the corresponding beam blanking units through which the respective beamlets pass.

The first blanking electrode may be configured for generating a first electric field between the first blanking electrode and the common electrode in the first aperture for deflecting a first beamlet of the multi-beamlet charged particle beam apparatus into a first deflection direction. The second blanking electrode may be configured for generating a second electric field between the second blanking electrode and the common electrode in the second aperture for deflecting a second beamlet of the multi-beamlet charged particle beam apparatus into a second deflection direction. The third blanking electrode may be configured for generating a third electric field between the third blanking electrode and the common electrode in the third aperture for deflecting a third beamlet of the multi-beamlet charged particle beam apparatus into a third deflection direction. Each of the N-3 blanking electrodes of the N-3 further blanking units, if present, may be correspondingly configured, i.e., for generating a $k^{th}$ electric field between the $k^{th}$ blanking electrode and the common electrode in the $k^{th}$ aperture for deflecting a $k^{th}$ beamlet of the multi-beamlet charged particle beam apparatus into a $k^{th}$ deflection direction, where k is in the range from 4-N.

A dividing plane intersecting the planar array separates the first blanking unit from the second blanking unit and the third blanking unit. The dividing plane may separate the blanking units of the beam blanking device into a first group and a second group, wherein the first group includes or consists of the first blanking unit, and the second group includes or consists of the second blanking unit and the third blanking unit. Any of the N-3 further blanking units may belong to the first group or to the second group. The first group and the second group may include the same number of blanking units or essentially the same number of blanking units. The first group and the second group may include the same number or essentially the same number of rows of blanking units or of columns of blanking units. The dividing plane may intersect the planar array in between blanking units, such as in between rows of blanking units or in between columns of blanking units, and/or may not be intersecting a blanking unit. The dividing plane may separate each row of blanking units into two half-rows. The dividing plane may separate each column of blanking units into two half-columns. The dividing plane may separate the planar array in equal or substantially equal halves. The dividing plane may intersect the planar array at or near a center of the planar array, the center being determined from the position of the outermost blanking units arranged in the planar array.

The dividing plane may intersect the planar array perpendicularly to the plane of the planar array. The dividing plane may be parallel to at least one of: the first optical axis, the second optical axis, the third optical axis, the optical axis of a $k^{th}$ blanking unit, where k is in the range from 4 to N, and the optical axis of the planar array. The dividing plane may be parallel to at least one of: the incoming direction of the first beamlet, the incoming direction of the second beamlet, the incoming direction of the third beamlet, the incoming direction of a $k^{th}$ beamlet, where k is in the range from 4 to N, and the incoming directions of some or all beamlets of the multi-beam charged particle beam apparatus.

According to some embodiments, the first deflection direction, the second deflection direction and the third deflection direction point away from the dividing plane. The $k^{th}$ deflection direction of a $k^{th}$ blanking unit may point away from the dividing plane, where k is in the range from 4-N. The deflection directions of all blanking units of the planar array may point away from the dividing plane. A deflection direction points away from a plane if the deflection direction has, on the side of the dividing plane where the deflection direction is defined by the corresponding blanking unit, a non-zero vector component that is perpendicular to the plane and pointing away from the plane. In other words, the non-zero vector component is proportional to an outwardly pointing normal of that plane. The second deflection direction and the third deflection direction may be parallel to each other. The first deflection direction may be a mirror image of the second deflection direction or third deflection direction, with the dividing plane being the mirror plane, or may be parallel to such a mirror image. The dividing plane may be a symmetry plane of the planar array. Blanking units on one side of the dividing plane may be mirror-images of blanking units on the other side of the dividing plane.

The first deflection direction may lie in a first deflection plane that is perpendicular to the plane of the planar array and that intersects the dividing plane. The first deflection plane may be a symmetry plane of the first blanking unit. The center of the first blanking electrode may lie on the first deflection plane. The center of the first aperture may lie on the first deflection plane. The second deflection direction may lie in a second deflection plane that is perpendicular to the plane of the planar array and that intersects the dividing plane. The second deflection plane may be a symmetry plane of the second blanking unit. The center of the second blanking electrode may lie on the second deflection plane. The center of the second aperture may lie on the second deflection plane. The third deflection direction may lie in a third deflection plane that is perpendicular to the plane of the planar array and that intersects the dividing plane. The third deflection plane may be a symmetry plane of the third blanking unit. The center of the third blanking electrode may lie on the third deflection plane. The center of the third aperture may lie on the third deflection plane. Any or all of the first deflection plane, the second deflection plane, and the third deflection plane may be perpendicular or substantially perpendicular to the dividing plane.

FIG. 1 illustrates an embodiment of a beam blanking device 100. The beam blanking device 100 includes a planar array 105 of blanking units, including a first blanking unit 110, a second blanking unit 120, and a third blanking unit 130. The first blanking unit 110, the second blanking unit 120 and the third blanking unit 130 define or span the plane A of the planar array 105. In FIG. 1, the planar array 105 is shown to have twelve blanking units arranged in a square lattice with m=4 rows and n=3 columns. The beam blanking device 100 includes a common electrode 108 that is co-operating with the respective blanking electrodes of the blanking units to create electric fields within the apertures of the blanking units for deflecting the beamlets that pass through the apertures. A dividing plane D separates the first blanking unit 110 from the second blanking unit 120 and the third blanking unit 130. The dividing plane D is perpendicular to the plane A, intersects the planar array between the second and third columns of blanking unit, and separates the twelve blanking units into two groups of blanking units having the same size, namely a first group including the first blanking unit 110, and a second group including the second blanking unit 120 and the third blanking unit 130. The dividing plane D is a symmetry plane (mirror plane) of the planar array 105. The dividing plane, just like the plane of the planar array or any plane, line or point recited herein, need not be a physical object, and can be a geometric object defining geometric properties of a physical object, such as the arrangement, orientation and/or configured operation of the blanking units.

A first beamlet B1 arrives at the first blanking unit 110 with a first incoming direction I1 that is perpendicular to the plane A and that coincides with the optical axis of the first blanking unit 110 as defined by the aperture of the first blanking unit 110. A second beamlet B2 arrives at the second blanking unit 120 with a first incoming direction I2 that is perpendicular to the plane A and that coincides with the optical axis of the second blanking unit 120 as defined by the aperture of the second blanking unit 120. A third beamlet B2 arrives at the third blanking unit 130 with a first incoming direction I3 that is perpendicular to the plane A and that coincides with the optical axis of the third blanking unit 130 as defined by the aperture of the third blanking unit 130.

In FIG. 1, the blanking electrodes of the first blanking unit 110, the second blanking unit 120 and the third blanking unit 130 are on the same operating potential and there is a voltage difference to the common electrode 108. For instance, when the beamlets are formed by electrons, the common electrode may be grounded, and the first blanking unit 110, the second blanking unit 120 and the third blanking unit 130 may be provided with a negative voltage. The first beamlet B1 is deflected in the aperture of the first blanking unit 110, and propagates in a first deflection direction D110. The first deflection direction D110 has a vector component parallel to the dividing plane D and perpendicular to the plane A, and has a vector component in the direction of an outwardly pointing normal $nD_1$ of the dividing plane. The second beamlet B2 is deflected in the aperture of the second blanking unit 120, and propagates in a second deflection direction D120. The third beamlet B3 is deflected in the aperture of the third blanking unit 130, and propagates in a third deflection direction D130. Each of the second and third deflection directions D120, D130 has a vector component parallel to the dividing plane D and perpendicular to the plane A, and a vector component in the direction of an outwardly pointing normal $nD_2$ of the dividing plane. Since the second blanking unit 120 and the third blanking unit 130 are on the opposite side of the dividing plane as compared to the first blanking unit 110, an outwardly pointing normal $nD_2$ on the side of any of the second blanking unit 120 and the third blanking unit 130 is also opposite to the outwardly pointing normal $nD_1$ on the side of the first blanking unit 110, as shown in FIG. 1. The blanking electrodes, the corresponding blanking units, and the beam blanking device as a whole are configured so that the first deflection direction D110, the second deflection direction D120 and the third deflection direction D130 point away from the dividing plane.

Figure 2:
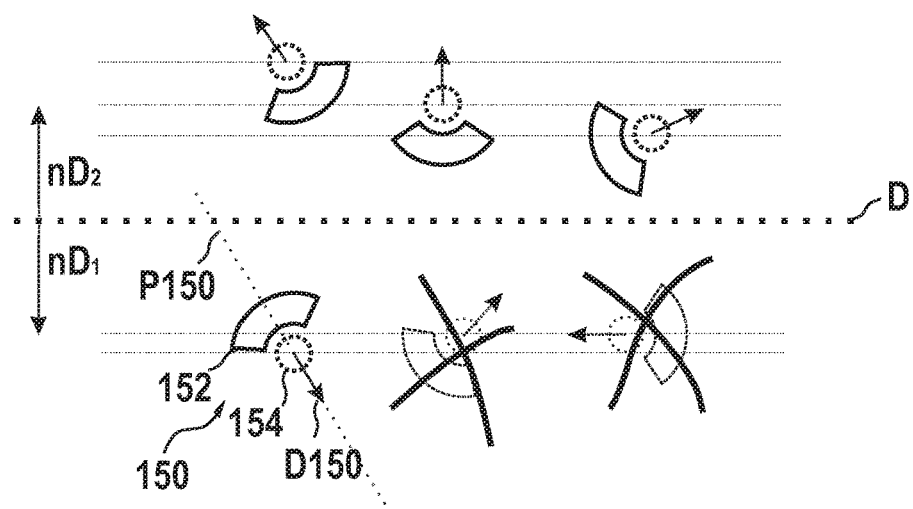
FIG. 2 illustrates certain aspects of the deflection directions of blanking units of beam blanking devices in accordance with embodiments described herein.

FIG. 2 illustrates when a deflection direction points away from the dividing plane D. FIG. 2 is a projection into the plane of the planar array of the beam blanking device. Vector components of the deflection directions in the direction perpendicular to the plane of the planar array are therefore not visible. The dividing plane D is shown as well as an outwardly pointing normal $nD_1$ and an outwardly pointing normal $nD_2$ on each side of the dividing plane D. A blanking unit 150 is exemplarily shown, the blanking unit including the blanking electrode 152 and the aperture 154. The blanking unit 150 deflects a beamlet into the deflection direction D150. The deflection direction D150 has a vector component proportional to the outwardly pointing normal $nD_1$, so the deflection direction D150 is pointing away from the dividing plane D, irrespective of whether the deflection direction D150 also has a vector component parallel to the dividing plane D and to the plane of the planar array. The deflection direction D150 lies in a deflection plane P150 that is perpendicular to the plane of the planar array. The two other blanking units below the dividing plane D in FIG. 2 do not deflect the beamlets away from the dividing plane, but towards the dividing plane or parallel thereto. These two other blanking units are therefore crossed-out in FIG. 2. Above the dividing plane D in FIG. 2, three more blanking units are shown that are configured to generate respective electric fields in their aperture, between their blanking electrodes and the common electrode, for deflecting their beamlets into deflection directions that point away from the dividing plane. Therein, the one in the middle deflects the beamlet in a direction perpendicular to the dividing plane, i.e., straight away from the dividing plane.

Figure 3:
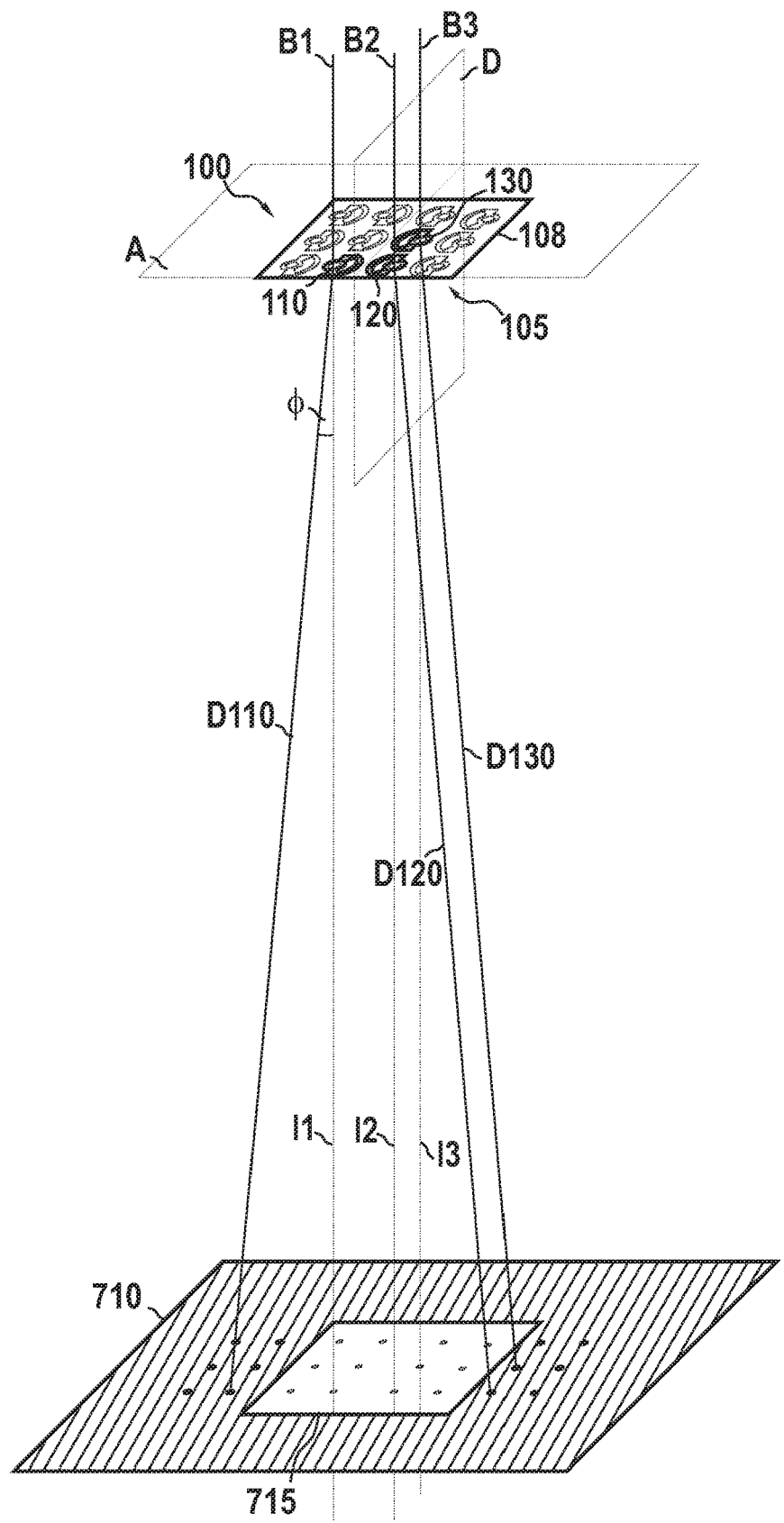
FIG. 3 shows a beam blanking device and a beam dump of a multi-beamlet charged particle beam apparatus in accordance with embodiments described herein.

FIG. 3 shows the beam blanking device 100 and a beam dump 710 of a multi-beamlet charged particle beam apparatus. The beam dump includes an aperture 715. When a beamlet is not deflected in the beam blanking device, meaning that the blanking unit which the beamlet passes through is not activated (no voltage difference between the common electrode and the blanking electrode of that blanking unit), the beamlet propagates in the incoming direction of the beamlet, as exemplarily shown for the beamlets B1, B2 and B3 with incoming directions I1, I2 and I3. Undeflected beamlets pass through the aperture 715 of the beam dump 710. The positions of the undeflected beamlets of the twelve blanking units of the beam blanking device 100 are shown in the plane of the beam dump 710 with dashed circles. When a beamlet is deflected in the blanking unit that the beamlet passes through, the beamlet is deflected into a deflection direction, as exemplarily shown for the beamlets B1, B2 and B3 and corresponding deflection directions D110, D120 and D130. The positions of the deflected beamlets of the twelve blanking units of the beam blanking device 100 are shown on the beam dump 710 with solid-line circles. In FIG. 3, the beamlets passing through the blanking units on the left side of the dividing plane D, including the first beamlet B1 passing through the first blanking unit 110, are deflected to the left side of the aperture 715 and are blanked by the beam dump 710, whereas the beamlets passing through the blanking units on the right side of the dividing plane D, including the second beamlet B2 passing through the second blanking unit 120 and the third beamlet B3 passing through the third blanking unit 130, are deflected to the right side of the aperture 715 and are blanked by the beam dump 710. The angle between the incoming direction, equaling the direction in which an undeflected beamlet propagates downstream of the beam blanking device, and the deflection direction of the same beamlet when the beamlet is deflected by the beam blanking device is called the deflection angle. The deflection angle $\angle$ of the first beamlet B1 is shown in FIG. 3, i.e., the angle between the first incoming direction I1 and the first deflection direction B1. The deflection angles of the blanking units may be the same, but may alternatively be different, e.g., if different voltages were applied to the beam blanking electrodes of the beam blanking units.

By deflecting the beamlets on one side of the dividing plane differently than the beamlets on the other side of the dividing plane, namely both away from the dividing plane, such as straight away from the dividing plane, the distance-to-blank is reduced as compared to deflecting all beamlets in the same (i.e., parallel) deflection directions. In FIG. 3, the centermost beamlets, e.g., beamlets B1, B2 or B3, are the most critical with the largest distance-to-blank. The distance-to-blank is thus approximately cut in half as compared to a case where even the leftmost beamlets are deflected to the right side of the aperture 715 of the beam dump 710 (or the rightmost beamlets are deflected to the left side of the aperture 715). Accordingly, the deflection angle(s) necessary to blank the beamlets can be smaller. This can have multiple advantages, taking into account that deflection increases with an increase of the voltage difference applied between the blanking electrodes and the common electrode, that the deflection decreases with a decreasing thickness of the planar array or height of the blanking electrodes in the direction of the optical axes, that there is a maximum of the voltage difference beyond which the beam blanking units become inoperable due to arcing between the blanking electrodes and the common electrode, and that it is advantageous if there are margins between both the undeflected and the deflected beamlets and the border of the aperture of the beam dump. Therefore, at the same voltage difference compared to the case where even the leftmost beamlets are deflected to the right side of the aperture of the beam dump, one can make the aperture larger and may still increase said margins. One can decrease said voltage difference, which can reduce cross-talk, and still obtain the same margins. Or one can miniaturize the electrodes, particularly their heights along the optical axes, and ultimately miniaturize the blanking units while maximizing shielding between the blanking units, and still obtain a sufficient deflection for blanking on the beam dump. This can reduce cross-talk and production complexity and cost.

According embodiments that can be combined with other embodiments described herein, a first line from a center of the first blanking electrode through a center of the first aperture, a second line from a center of the second blanking electrode through a center of the second aperture and a third line from a center of the third blanking electrode through a center of the third aperture either point away from the dividing plane or point toward the dividing plane. A line is said to point away from a plane if the line has a non-zero vector component that is perpendicular to the plane and pointing away from the plane, and is said to point toward a plane if the line has a non-zero vector component that is perpendicular to the plane and pointing toward the plane.

Figure 4:
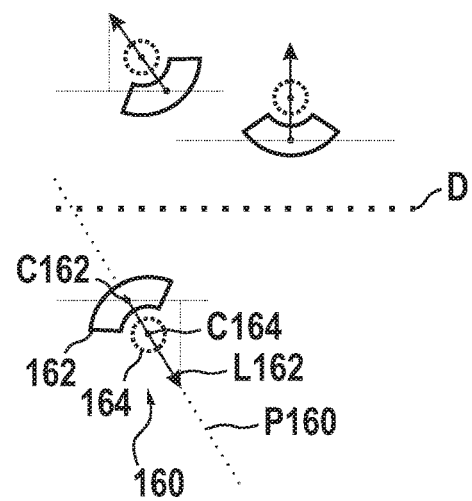
FIGS. 4-6 illustrate aspects of the arrangement and of deflection directions of blanking units of beam blanking devices in accordance with embodiments described herein.
Figure 5:
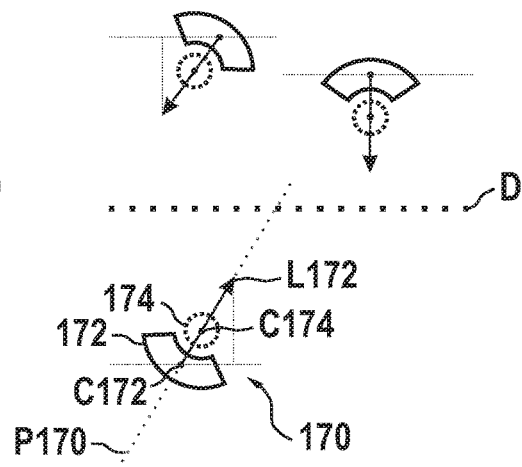

FIGS. 4 and 5 illustrate the situations, representing projections into the plane of the planar array, with the dividing plane D being shown. In FIG. 4, a blanking unit 160 with a blanking electrode 162 and an aperture 164 is shown. The line L162 originating from the center C162 of the blanking electrode 162 and passing through the center C164 of the aperture 164 has a vector component perpendicular to the dividing plane D that points away from the dividing plane D. The blanking unit 160 therefore has a line L162 from the center C162 of the blanking electrode 162 through the center C164 of the aperture 164 that points away from the dividing plane D. The center C162 of the blanking electrode 162 and the center C164 of the aperture 164 lie on the deflection plane P160 that is perpendicular to the plane of the planar array. The same is true for the other two blanking units shown above the dividing plane D, wherein the blanking unit on the top right has a line from the center through the aperture that points straight away from the dividing plane D, i.e., in a direction perpendicular to the dividing plane D. FIG. 5 shows the other situation, where lines from the respective centers of the blanking electrodes through the centers of the respective apertures point toward the dividing plane D. For instance, the blanking unit 170 includes the blanking electrode 172 and the aperture 174, and a line L172 from the center C172 of the blanking electrode 172 through the center C174 of the aperture 174 points towards the dividing plane D. This is because the line L172 has a vector component perpendicular to the dividing plane D, and this vector component points towards the dividing plane D. The center C172 of the blanking electrode 172 and the center C174 of the aperture 174 lie on the deflection plane P170 that is perpendicular to the plane of the planar array.

When there are N-3 further blanking units in the planar array of the beam blanking device, then, for some or all k in the range from 4 to N, a $k^{th}$ line from a center of the $k^{th}$ blanking electrode through a center of the $k^{th}$ aperture may point away from the dividing plane, particularly if the first, second and third lines point away from the dividing plane, or may point toward the dividing plane, particularly if the first, second and third lines point toward the dividing plane. The first, second and third lines, and any $k^{th}$ line, may point straight away from the dividing plane, or straight toward the dividing plane. That means, these lines may point in a direction perpendicular to the dividing plane, and either away or towards the dividing plane. The first, second and third lines, and any $k^{th}$ line, may point substantially straight away from the dividing plane, or substantially straight toward the dividing plane. Therein, "substantially" means within ±5° of pointing in a direction perpendicular to the dividing plane.

Figure 6:
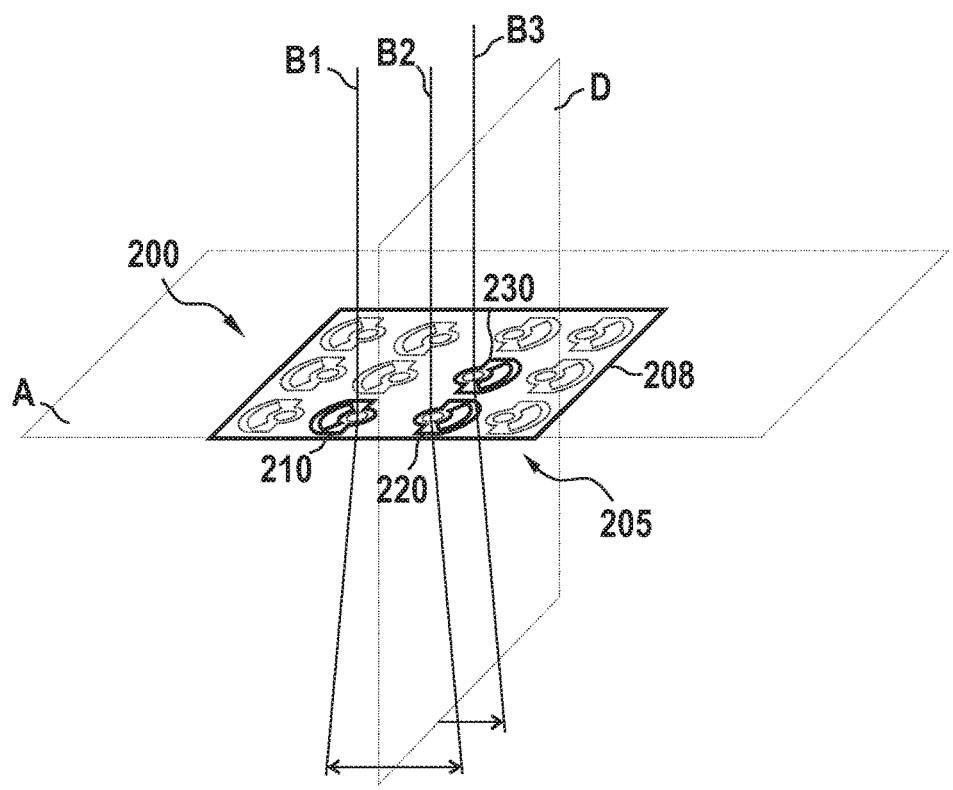

The planar array 105 of the beam blanking device 100 of FIG. 1 is an embodiment in which, for each blanking unit, a line from the center of the blanking electrode through the center of the aperture points straight away from the dividing plane D. FIG. 6 illustrates an embodiment of a beam blanking device 200, including a planar array 205 that includes blanking units, including a first blanking unit 210, a second blanking unit 220 and a third blanking unit 230, and a common electrode 208, wherein, for each blanking unit, a line from the center of the blanking electrode through the center of the aperture points straight toward the dividing plane D. The voltage applied to the blanking electrodes is such that the voltage difference to the common electrode has an opposite sign as compared to the embodiment of FIG. 1, and so the deflection directions of all blanking units still point away from the dividing plane, as illustrated for the first blanking unit 210, the second blanking unit 220 and the third blanking 230. For instance, if the beamlets are formed by electrons and the common electrode is grounded, the voltage applied to the blanking electrodes is made positive. With such arrangements of the blanking units, the beamlets can be deflected away from the dividing plane while the same operating potential can be applied to the blanking electrodes of all blanking units, or, at least, a voltage difference with respect to the common electrode having the same sign can be applied to the blanking electrodes of all blanking units by a voltage source of the beam blanking device. This can simplify the voltage source and/or the connections to the blanking electrodes.

According to other embodiments, the first deflection direction, the second deflection direction, and the third deflection direction may point away from a dividing line, alternatively or additionally to pointing away from a dividing plane. The dividing line may intersect the planar array perpendicularly to the plane of the planar array. The dividing line may be parallel to at least one of: the first optical axis, the second optical axis, the third optical axis, the optical axis of a $k^{th}$ blanking unit, where k is in the range from 4 to N, and the optical axis of the planar array. The dividing line may be parallel to at least one of: the incoming direction of the first beamlet, the incoming direction of the second beamlet, the incoming direction of the third beamlet, the incoming direction of a $k^{th}$ beamlet, where k is in the range from 4 to N, and the incoming directions of some or all beamlets of the multi-beam charged particle beam apparatus. Additionally or alternatively, the first line from the center of the first blanking electrode through the center of the first aperture, the second line from the center of the second blanking electrode through the center of the second aperture and the third line from the center of the third blanking electrode through the center of the third aperture either all point away from the dividing line or all point toward the dividing line. A line is said to point away from the dividing line if the line has a non-zero vector component that is perpendicular to the dividing line and pointing away from the dividing line, and is said to point toward a dividing line if the line has a non-zero vector component that is perpendicular to the dividing line and pointing toward the dividing line.

Figure 7:
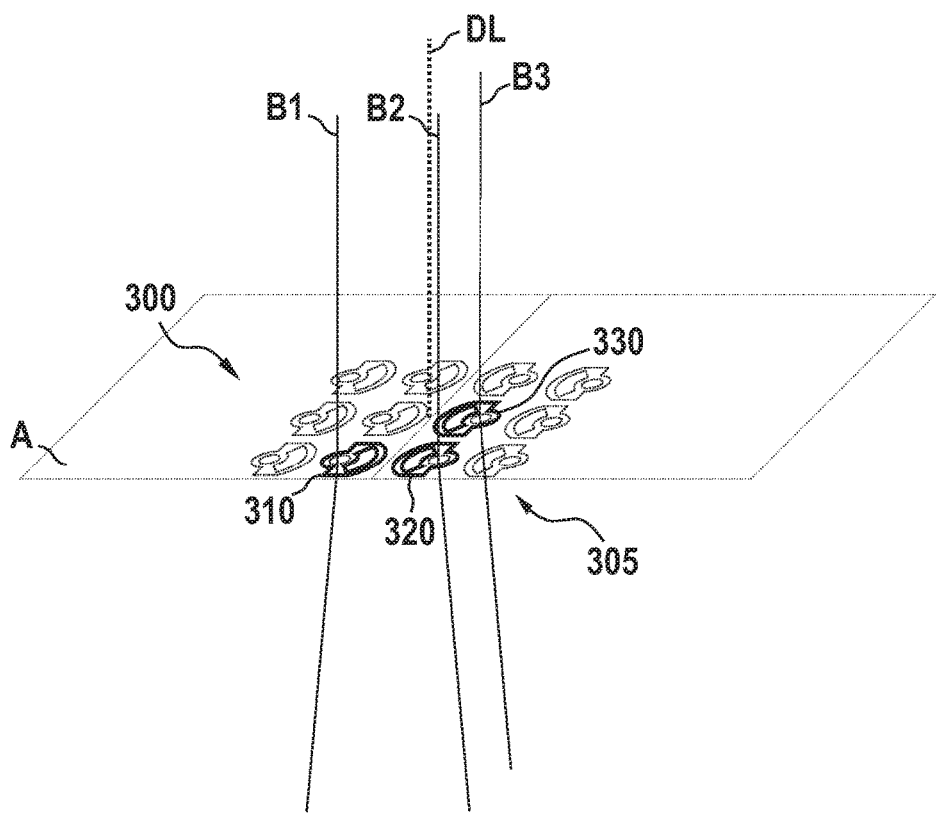
FIG. 7 shows a beam blanking device in accordance with embodiments described herein.
Figure 8:
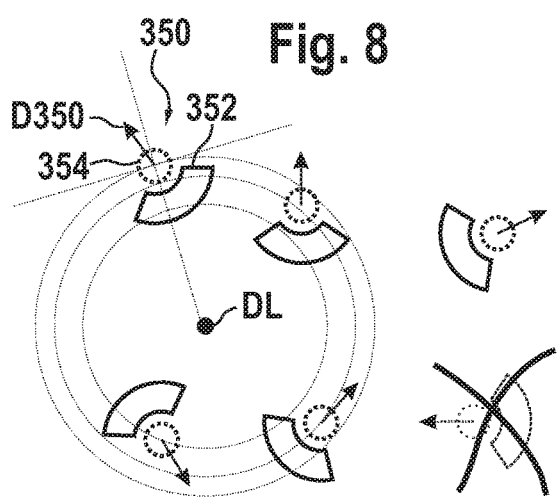
FIGS. 8-9 illustrate further aspects of the arrangement and of deflection directions of blanking units of beam blanking devices in accordance with embodiments described herein.

FIG. 7 illustrates such an embodiment, featuring a beam blanking device 300 that includes a first blanking unit 310, a second blanking unit 320, and a third blanking unit 330 arranged in a planar array 305. The first deflection direction into which beamlet B1 is deflected by the first blanking unit 310 points away from a dividing line DL, and the same is true for the second deflection direction of beamlet B2 and the third deflection direction of beamlet B3. FIG. 8 illustrates the meaning of a deflection direction pointing away from the dividing line. FIG. 8 is a projection into the plane of the planar array and shows five blanking units that deflect beamlets away from the dividing line DL. Blanking unit 350 with blanking electrode 352 and aperture 354 is exemplarily shown among these five blanking units. The blanking unit 350 is arranged and configured so that the deflection direction D350 of the beamlet passing through the aperture 354 has a vector-component in a direction perpendicular to the dividing line DL, and so is pointing away from the dividing line DL. When using cylindrical coordinates with the dividing line DL forming the height (z) and the coordinates visible in the projection of FIG. 8 being radial (r) and azimuthal ($\phi$)) coordinates, the vector component in the direction perpendicular to the dividing plane is the radial component. The blanking unit shown on the top right deflects the beamlet so that the beamlet is pointing straight away from the dividing line DL, i.e., the beamlet has no azimuthal vector component in the cylindrical coordinates. The blanking unit on the bottom right that is crossed out does not exhibit a deflection direction pointing away from the dividing line DL, but toward the dividing line DL.

Figure 9:
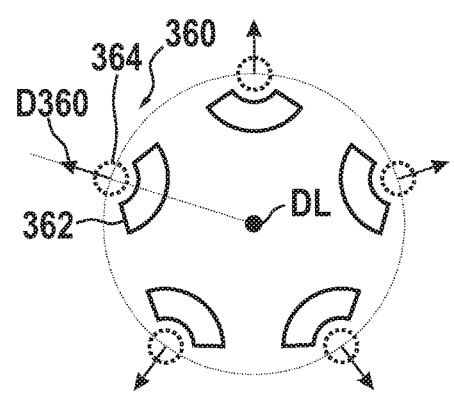

FIG. 9 shows an embodiment of a beam blanking device that includes five beam blanking units which arranged in a circle around the dividing line DL and which are configured so that the deflection directions point straight away from the dividing line DL. The five blanking units include blanking unit 360 with blanking electrode 362 and aperture 364. The blanking electrode 362 generates, together with a common electrode that is not shown, an electric field in the aperture 364 so that the beamlet passing through the aperture 364 is deflected in a deflection direction that points straight away from the dividing line DL. The beam blanking device may include further blanking units (not shown) that can be arranged in concentric circles around the dividing line DL and which also deflect straight away from the dividing line DL.

Depending on the geometry of the planar array, i.e., on the arrangement of the blanking units including the positions and orientations of the blanking units, deflections of the beamlets straight away from a dividing line may minimize the maximal distance-to-blank even more than deflections straight away from a dividing plane. The deflection angles can then become smaller, leading to the previously described advantages.

Figure 10:
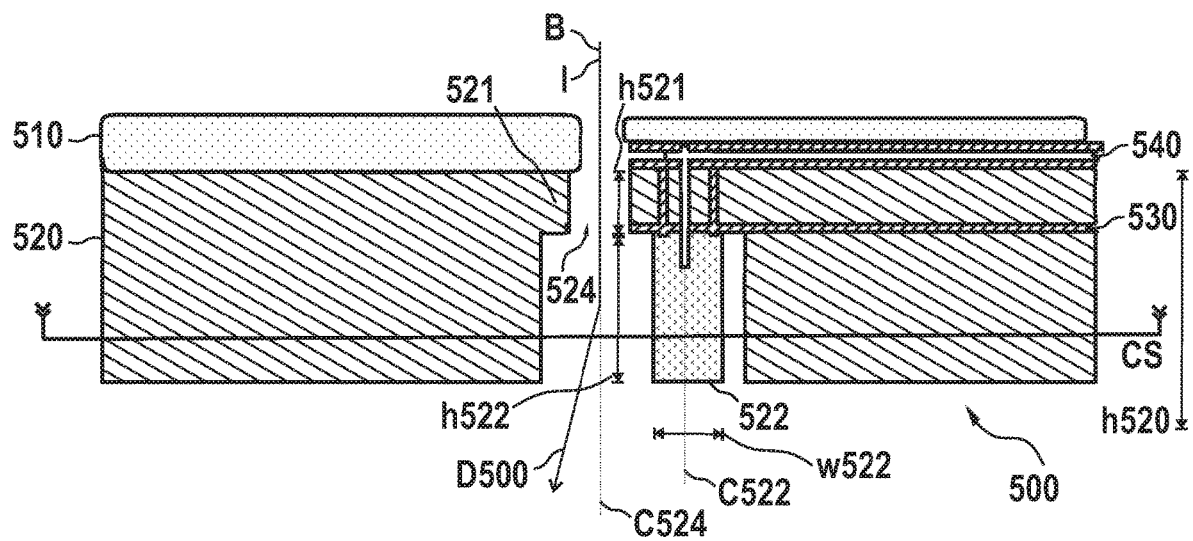
FIGS. 10-11 show a beam blanking unit for a beam blanking device in accordance with embodiments described herein.
Figure 11:
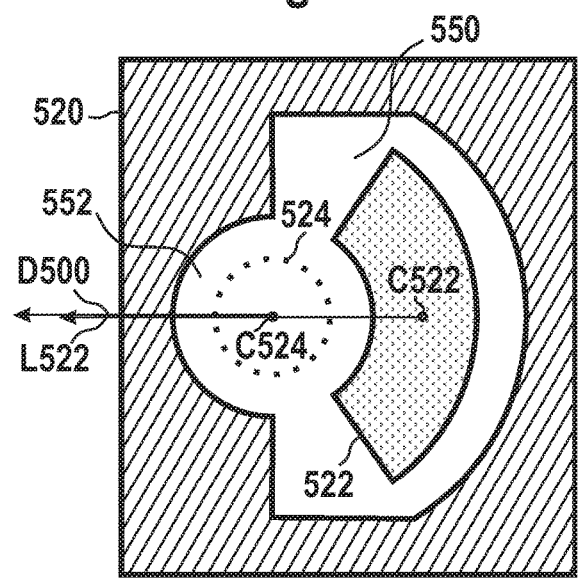

FIGS. 10 and 11 show a blanking unit 500 which can be used in embodiments described herein, the blanking unit 500 being a wafer-based blanking unit. In a wafer-based blanking unit the components can be formed out of a layer stack that includes at least one wafer, or can be formed on a wafer, e.g., by deposition techniques. In FIGS. 10 and 11, the blanking unit 500 includes a wafer 510. The blanking unit includes a blanking electrode 522 having a center C522, and an aperture 524 having a center C524, the center C524 forming the optical axis of the blanking unit 500. FIG. 10 shows a cross-section through the blanking unit 500 in a deflection plane that is perpendicular to the plane of the planar array and passing through the center C524 and the center C522. FIG. 11 is a cross-section along the plane CS shown in FIG. 10, and viewed from above as indicated by the arrows. The deflection direction D500 and the line L522 from the center C522 of the blanking electrode 522 to the center C524 of the aperture 524 lie in the deflection plane. The deflection plane is a symmetry plane of the blanking unit 500. The blanking electrode 522 has a width w522, and the center C522 of the blanking electrode C522 lies in the deflection plane at half the width w522. The deflection direction D500 is shown in FIG. 10 as deflecting the beamlet B to the left of the incoming direction I, but the beamlet B could be deflected to the right of the incoming direction I if the voltage difference between the blanking electrode 522 and the common electrode 520 had the opposite sign. The wafer 510 and the common electrode 520 define the aperture 524.

The common electrode 520 shields the blanking electrode 522 from above, i.e., as viewed in the incoming direction I of the beamlet B. The common electrode includes a first horizontal shielding barrier 521 for shielding the blanking electrode from above, wherein the aperture 524 is formed in the first horizontal shielding barrier 521. The common electrode 520 surrounds the blanking electrode 522 along the entire height h522 of the blanking electrode, shielding the blanking electrode 522 from blanking electrodes of other blanking units. Although not shown in FIG. 10, the common electrode 520 may extend further down than the blanking electrode 522, i.e., further in the incoming direction I, to improve shielding to other blanking electrodes and reduce cross-talk. This is why the height h520 of the common electrode 520 is shown larger than the common electrode 520 is drawn. The common electrode 520 may also shield the blanking electrode 522 from the bottom, i.e., as viewed in a direction opposite to the incoming direction I. The shielding from below by the common electrode 520 may be similar to the shielding of the common electrode 520 from above. The common electrode 520 may form a second horizontal shielding barrier with a hole having the size of the aperture 524 and being aligned with the aperture 524 along the optical axis for shielding the blanking electrode 522 from below. Cross-talk was found to be most pronounced in the deflection direction, here in the deflection direction D500 or in the direction of the projection thereof into the plane of the planar array (i.e., left in FIG. 11). The shielding in the deflection directions therefore matters most to reduce cross-talk, unless blanking units arranged in the direction of the projections of their deflection directions into the plane of the planar array are configured to be blanked as a group, e.g., as a column, in which case the shielding in the deflection direction does not matter and can even be omitted, as described in more detail hereinbelow. The common electrode 520 forms a cavity 550 in which the blanking electrode 522 is arranged. The cavity 550 exhibits a notch 552. Considering the continuation of the shape of the aperture 524 in the incoming direction I of beamlet B, here shown as a dashed circle in FIG. 11, the notch 552 partly surrounds that shape of the aperture 524. The blanking electrode 522 is curved, here in the form of segment of an annulus, and also partly surrounds that shape of the aperture 524. The electric field deflecting the beamlet B is formed between the notch 552 and the inner surface of the blanking electrode 522 closest to the notch 552. The notch 552 can increase the deflection of the beamlet B and decrease cross-talk to other beamlets as compared to a situation where the inner surface of the common electrode opposite of the inner surface of the blanking electrode is straight. Also, and to an even larger degree, the curvature of the blanking electrode can increase the deflection of the beamlet B and decrease cross-talk to other beamlets as compared to a situation where the inner surface the blanking electrode is straight.

The blanking unit 500 includes a conductive path 540, insulated from the wafer 510 and from the common electrode 520 by insulating layers 530. The conductive path 540 electrically connects to the blanking electrode 522, allowing for a potential to be applied to the blanking electrode. The conductive path 540 may be part of, or connected to, control circuitry which connects to a voltage source, allowing to switch the blanking electrode 522 off by putting the blanking electrode 522 on the same potential as the common electrode, such as ground, and allowing to switch the blanking electrode 522 on by putting the blanking electrode on a specific operating potential other than that of the common electrode. For instance, if the beamlet B is an electron beam, the common electrode may be put to ground potential and the blanking electrode 522 to a negative operating potential to establish a voltage difference that deflects the beamlet B in the deflection direction D500 shown in FIG. 10. The conductive path 540 and the insulating layers 530 can, just like the other components of the blanking unit 500 shown in FIG. 10, be fabricated by wafer technology. If, according to embodiments described herein, a smaller deflection angle is needed to blank the beamlet then the height of the common electrode and of height of the blanking electrode can be reduced. This reduction allows to reduce the aspect ratio of the cavity that surrounds the blanking electrode and of the aperture. This makes manufacturing with wafer technology easier, in particular etching processes such as a Bosch etch process to create structures like those shown in FIG. 10. A wafer-based beam blanking device, i.e. a beam blanking device including blanking units such as the blanking unit 500 fabricated by wafer technology, can also include the control circuitry on the wafer, which can be common to all blanking units, or can include the control circuitry on a stack of wafers. Wafer-based beam blanking devices can be miniaturized very much. For instance, the height h520 of the common electrode could be 700 µm or smaller, the height h521 of the first horizontal shielding barrier 521 may be 25 µm or smaller, the width of the aperture 524 (here the diameter of the aperture 524) may be 100 µm or smaller, the width of the blanking electrode 522 may be 25 µm or smaller, the height h522 of the blanking electrode may be 250 µm or smaller. Making the width and/or height of the blanking electrode smaller decreases the capacitance of the blanking electrode, which can lead to faster switching speeds. Any of the blanking electrodes described herein may have a capacitance of below 100 pF, or even below 25 pF. Any of the blanking electrodes may be configured for a switching time of about 100 ns or less, or even 10 ns or less.

Figure 12:
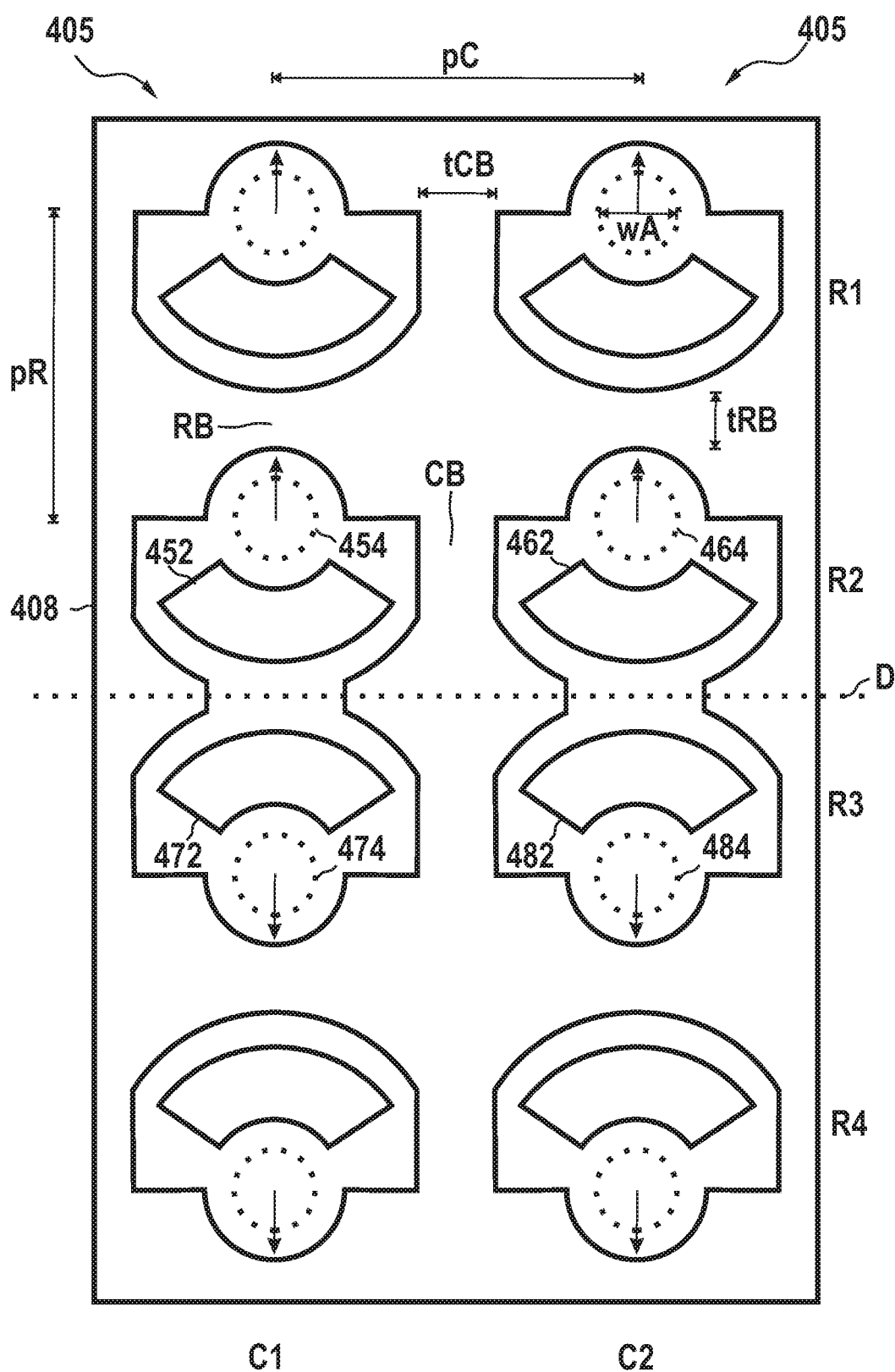
FIG. 12 shows a beam blanking device in accordance with embodiments described herein.

FIG. 12 shows a beam blanking device 400 including blanking units arranged in a planar array 405. Eight blanking units are shown, arranged in two columns C1 and C2 and four rows R1, R2, R3 and R4, but the beam blanking device 400 can include more blanking units, and more and larger rows and columns in which the blanking units are arranged. Each blanking unit has a blanking electrode and an aperture, such as blanking electrodes 452, 462, 472 and 482 and apertures 454, 464, 474 and 484. The aperture width wA is the same for the apertures 454, 464, 474 and 484. The blanking device 400 has a common electrode 408. A dividing plane D is a symmetry plane of the beam blanking device 400, dividing the planar array and the blanking units into two equally large halves, with the deflection directions of all blanking units pointing straight away from the dividing plane, as indicated by arrows starting at the centers of the apertures.

The vertical pitch or pitch between rows pR may be 250 µm or smaller, measured between the centers of apertures within one column. The horizontal pitch or pitch between columns pC may be 250 µm or smaller, measured between the centers of apertures within one row. The parts of the common electrode 408 between two blanking units within one column are called row barriers RB due to providing shielding between rows of blanking units, and the parts of the common electrode 408 between two blanking units within one row are called column barriers RC due to providing shielding between columns of blanking units. The thickness tCB of a column barrier CB may be 50 µm or smaller. The thickness tRB of a row barrier RB may be 75-125 µm. Between two neighboring blanking units within one column that are separated by the dividing line D no shielding is provided. This is because there is little crosstalk between such neighboring blanking units the deflection directions of which have vector components perpendicular to the dividing plane D and to the plane of the planar array 405 that point in opposite directions. The pair of blanking electrodes 452 and 472 are arranged one enlarged cavity of the common electrode 408, and the same is true for the pair of blanking electrodes 462 and 482. If the blanking units are not operated individually, but entire columns or half-columns are switched on or off jointly, the row barriers RB can also be omitted. While there might then be significant cross-talk within the column as the blanking units are switched on, this would not matter since then all beamlets of these blanking units would be blanked. Individually operable blanking units offer more flexibility for analyzing a sample. Blanking units that can only be jointly operated within a column or half-column offer less flexibility, but can reduce the problem of cross-talk and can simplify the circuitry. For instance, the control circuitry can be simplified because the control circuitry need only jointly switch the entire column or half-column. Alternatively, the conductive paths to the blanking units within one column or half-column could be connected on the wafer so that the conductive paths are always on the same potential and can only be switched jointly.

A beam blanking device in accordance with embodiments described herein may include at least one of the following components or possess at least one of the following properties. The beam blanking device may include, or be connected to, a voltage source. The beam blanking device may include control circuitry, also called driving circuitry or driving electronics. The control circuitry may be connected to the first blanking electrode, the second blanking electrode, and the third blanking electrode. The control circuitry may be connected to any $k^{th}$ blanking electrode of a $k^{th}$ blanking unit of the beam blanking device, where k is in the range from 4 to N. The control circuitry may be connected to, or connectable to, the voltage source. The voltage source may be configured to provide an operating potential. The control circuitry may be configured to selectively put each of the first blanking electrode, the second blanking electrode and the third blanking electrode on different potentials. The different potentials include or consist of the operating potential and a reference potential. The different potentials may include a potential expressed as 2*reference potential−operating potential. The beam blanking device may be configured such that the common electrode is put on the reference potential. The reference potential may be ground. The operating potential may be in the range from 10 to 400 volts or from −10 to −400 volts as compared to the reference potential, such as in the range from 100 to 200 volts or from −100 to −200 volts.

When a blanking electrode is selectively put on the operating potential by the control circuitry then the state of the blanking electrode is referred to as "on", and when the blanking electrode is selectively put on the reference potential by the control circuitry then the state of the blanking electrode is referred to as "off". The control circuitry may be configured to switch the first blanking electrode, i.e., to change the state of the first blanking electrode from on to off, and vice versa. The control circuitry may be configured to switch the second blanking electrode. The control circuitry may be configured to switch the third blanking electrode. The control circuitry may be configured to switch a $k^{th}$ blanking electrode, for some or all k from 4 to N. The control circuitry may be configured to switch some or all of the blanking units of the beam blanking device independently, e.g., the first blanking electrode independently from the second blanking electrode, and both the first blanking electrode and the second blanking electrode independently from the third blanking electrode. The control circuitry may be configured to switch some, but not all, of the blanking units of the beam blanking device jointly. The control circuitry may be configured to switch blanking units within groups jointly, but any of the groups of blanking units independently of other groups. Such groups may be columns of beam blanking units or half columns of blanking units on one side of the dividing plane. Such groups may be formed from blanking units having the same deflection direction, i.e., parallel deflection directions, or from blanking units whose deflection directions lie in the same deflection plane.

At least one, some or all of the blanking units of the beam blanking device, including at least one, some or all of the first, second, third and any $k^{th}$ blanking units, where k is in the range from 4 to N, may include at least one of the following components or possess at least one of the following properties, described with respect to one blanking unit hereinafter for simplicity. The blanking electrode of the blanking unit may be a curved blanking electrode, such as a segment of an annulus. A curved blanking electrode has surface of higher curvature, and this is where a curved blanking electrode is to face. The blanking electrode may face the dividing plane or face away from the dividing plane. The blanking electrode may face a partnering notch of the common electrode. The blanking electrode and the partnering notch may each partially surround a continuation of the aperture in the direction of the optical axis. The common electrode may define the aperture of the blanking unit.

The beam blanking device may be a wafer-based beam blanking device. The beam blanking device may include a wafer, such as a silicon wafer. The wafer may define the first aperture, the second aperture and the third aperture. The wafer may define the apertures of all blanking units of the beam blanking device. At least one of, some of, or all of the common electrode, the first blanking electrode, the second blanking electrode, the third blanking electrode, and any $k^{th}$ blanking electrode may be deposited on the wafer. The material of at least one of, some of, or all of the common electrode, the first blanking electrode, the second blanking electrode, the third blanking electrode, and any $k^{th}$ blanking electrode may be a metal such as gold, molybdenum, aluminum, copper, chromium, titanium, tungsten, platinum, and silver. The first blanking unit may include a first conductive path connected to the first blanking electrode. The first conductive path may be part of the control circuitry to switch the first blanking electrode. The first conductive path may be a printed layer. The first conductive path may insulated from the common electrode by at least one insulating layer. The first conductive path and the at least one insulating layer may be formed on the wafer by printed circuit board (PCB) techniques. The first blanking electrode may be arranged in a first cavity of the common electrode. The first blanking electrode may be formed on an insulating layer separating the first blanking electrode from a first horizontal shielding barrier in the direction of the first optical axis. The same may hold for the second blanking unit, the third blanking unit and any $k^{th}$ blanking unit. Therein, k may be in the range from 4 to N.

A pitch between neighboring blanking units, measured between the centers of the respective apertures, may be in the range from 100 µm to 1000 µm, e.g., in the range from 100 µm to 300 µm. The pitch may be a pitch between rows and/or a pitch between columns. The thickness (width) of shielding barriers, being parts of the common electrode, may be in the range from 10 µm to 300 µm, e.g., in the range from 20 µm to 150 µm. The shielding barriers may be row barriers and/or column barriers. The width of blanking electrodes may be in the range from 10 µm to 100 µm, e.g., in the range from 20 µm to 50 µm. The height of blanking electrodes may be in the range from 100 to 1000 µm, e.g., in the range from 200 to 500 µm. The height of the common electrode, in particular of the shielding barriers that the common electrode forms, may be in the range from 200 µm to 3000 µm, e.g., in the range from 400 to 1000 µm.

According to further embodiments, a beam blanking device for a multi-beamlet charged particle beam apparatus is provided. The beam blanking device includes a first blanking unit including a first curved blanking electrode, a second blanking unit including a second curved blanking electrode, a third blanking unit including a third curved blanking electrode, and a common electrode forming a first counter electrode for the first curved blanking electrode, a second counter electrode for the second curved blanking electrode and a third counter electrode for the third curved blanking electrode. The first blanking unit, the second blanking unit and the third blanking unit are arranged in a planar array and define a plane of the planar array. A dividing plane intersecting the planar array, such as perpendicularly to the plane of the planar array, separates the first blanking unit from the second blanking unit and the third blanking unit, wherein the first curved blanking electrode, the second curved blanking electrode and the third curved blanking electrode face away from the dividing plane or face toward the dividing plane. Alternatively, or additionally, the first curved blanking electrode, the second curved blanking electrode and the third curved blanking electrode face may face away from a dividing line intersecting the plane of the planar array, or may face toward the dividing line.

According to further embodiments, a beam blanking device may include blanking units that share a common electrode and that are arranged in a planar array and define a plane of the planar array. Each of the blanking units is arranged for deflecting a beamlet of a multi-beamlet charged particle beam apparatus away from a dividing plane that intersects the planar array, e.g., perpendicularly to the plane of the planar array, and that separates the blanking units into a first group and into a second group. Each of the blanking units may be arranged for deflecting the beamlet straight away from the dividing plane. Alternatively, or additionally, each of the blanking units may be arranged for deflecting the beamlet away from a dividing line that intersects the plane of the planar array. Each of the blanking units may include an aperture and may include a blanking electrode arranged for generating an electric field between the blanking electrode and the common electrode in the aperture for deflecting the beamlet of the multi-beamlet charged particle beam apparatus away from the dividing plane. Each of the blanking units may be arranged for deflecting the beamlet of the multi-beamlet charged particle beam apparatus in a deflection direction, wherein, for each of the blanking units, the deflection direction lies in a deflection plane that is perpendicular to the plane of the planar array and that intersects the dividing plane. Therein, at least one of the following may hold: a) the deflection plane of each of the blanking units is perpendicular to the dividing plane, b) the deflection planes of the blanking units are parallel to each other, c) each of the deflection planes of the blanking units of the first group is parallel to a mirror image of a deflection plane of a blanking unit of the second group, mirrored at the dividing plane. For each of the blanking units, a center of the blanking electrode is closer to the dividing plane than a center of the aperture. Alternatively, for each of the blanking units, a center of the blanking electrode is more remote from the dividing plane than a center of the aperture. For each of the blanking units, the blanking electrode may have a symmetry plane intersecting the aperture and the dividing plane. The blanking electrode may be arranged between the aperture and the dividing plane in the symmetry plane. Alternatively, the aperture may be arranged between the blanking electrode and the dividing plane in the symmetry plane. For each of the blanking units, the blanking electrode may be a curved blanking electrode partially surrounding a continuation of the aperture along an optical axis of the blanking unit. The planar array may have m rows and n columns, wherein n and m are larger than one, wherein the dividing plane intersects the planar array parallel to the m rows and in between two of the m rows, wherein x rows of the m rows are on one side of the dividing plane and the blanking units of the x rows belong to the first group, and m-x rows of the m rows are on the other side of the dividing plane and the blanking units of the m-x rows belong to the second group. Therein, x may be floor (m/2). The blanking units arranged in the planar array may include the first blanking unit, the second blanking unit, and the third blanking unit, as described herein.

According to further embodiments, a method of operating a beam blanking device of a multi-beamlet charged particle beam apparatus is provided. The beam blanking device includes blanking units that share a common electrode and that are arranged in a planar array and define a plane of the planar array. The blanking units may include, or consist of, the first blanking unit, the second blanking unit, and the third blanking unit as described herein. Each of the blanking units may be a blanking unit as described herein. The blanking units, the common electrode, the planar array, and the beam blanking device, and the multi-beamlet charged particle beam apparatus may be as described herein, i.e., possess some or all of the properties described, including arrangement, structure and geometry/dimensions.

According to further embodiments, a multi-beamlet charged particle beam apparatus is provided. The multi-beamlet charged particle beam apparatus may be a multi-beamlet electron beam apparatus, e.g., for electron beam inspection of a sample, such as a wafer. The multi-beamlet charged particle beam apparatus includes a beam blanking device as described herein. The multi-beamlet charged particle beam apparatus includes one or more charged particle beam sources, e.g., one or more electron beam sources, for generating multiple beamlets of charged particles. The multi-beamlet charged particle beam apparatus may include a beamlet formation stage in between the one or more charged particle beam sources and the beam blanking device. The beamlet formation stage may include charged particle beam optics for forming the beamlets to arrive at the beam blanking device along incoming directions. The incoming directions may be aligned with an optical axis of the beam blanking device or with optical axes of the blanking units of the beam blanking device. The multi-beamlet charged particle beam apparatus includes a beam dump downstream of the beam blanking device, the beam dump including an aperture. The beam dump is arranged and configured to blank beamlets that are being deflected by the beam blanking device and to let beamlets not being deflected by the beam blanking device pass through the aperture of the beam dump. The multi-beamlet charged particle beam device may include an objective lens for focusing the beamlets on the sample, and may include a sample support for supporting the sample.

The method includes deflecting, with each of the blanking units, a beamlet of the multi-beamlet charged particle beam apparatus away from a dividing plane, such as straight away from the dividing plane. The dividing plane intersects the planar array and separates the blanking units into a first group and into a second group. FIG. 13 illustrates such a method 600, starting at 610, and including the deflection 620, with each of the blanking units of the beam blanking device, of a beamlet away from the dividing plane. The first group may include the first blanking unit described herein, and the second group may include the second blanking unit and the third blanking unit described herein. The dividing plane may intersect the planar array perpendicularly to the plane of the planar array. The deflection of each of the blanking units may be simultaneous with the deflections of other blanking units or may be made at different points in time. The method may include blanking beamlets which are being deflected, e.g., by a beam dump as described herein. For each of the blanking units, deflecting a beamlet may include switching the blanking unit on.

The method may include putting the common electrode to a reference potential, e.g., to ground. The method may include providing one and only one operating potential, e.g., by a voltage source, and deflecting with each of the blanking units may include putting the blanking unit on the operating potential. Alternatively, the method may include providing a first operating potential and a second operating potential, e.g., by one voltage source or two voltage sources. The following relation may hold: the first operating potential equals two times the reference potential minus the second operating potential. Deflecting with each of the blanking units may include putting the blanking units of the first group on the first operating potential, and putting the blanking units of the second group on the second operating potential. Therein, each of the blanking electrodes of the blanking units may face in the same direction. Deflecting with each of the blanking units may include deflecting the beamlet by a deflection angle, the deflection angle being larger than 10 mrad. Deflecting with each of the blanking units may include deflecting other beamlets by less than 0.0001 mrad.

The invention claimed is:

1. A beam blanking device for a multi-beamlet charged particle beam apparatus, comprising:
   a first blanking unit including a first blanking electrode and a first aperture;
   a second blanking unit including a second blanking electrode and a second aperture;
   a third blanking unit including a third blanking electrode and a third aperture; and
   a common electrode forming a first counter electrode for the first blanking electrode, a second counter electrode for the second blanking electrode and a third counter electrode for the third blanking electrode,
   wherein the first blanking unit, the second blanking unit and the third blanking unit are arranged in a planar array and define a plane of the planar array,
   wherein the first blanking electrode is arranged for generating a first electric field between the first blanking electrode and the common electrode in the first aperture for deflecting a first beamlet of the multi-beamlet charged particle beam apparatus into a first deflection direction, the second blanking electrode is arranged for generating a second electric field between the second blanking electrode and the common electrode in the second aperture for deflecting a second beamlet of the multi-beamlet charged particle beam apparatus into a second deflection direction, and the third blanking electrode is arranged for generating a third electric field between the third blanking electrode and the common electrode in the third aperture for deflecting a third beamlet of the multi-beamlet charged particle beam apparatus into a third deflection direction,
   wherein a dividing plane intersecting the planar array separates the first blanking unit from the second blanking unit and the third blanking unit, wherein the first deflection direction, the second deflection direction and the third deflection direction point away from the dividing plane, and
   wherein the common electrode shields the first, second and third blanking electrodes from above or from below or both from above and below.

2. The beam blanking device of claim 1, wherein the dividing plane intersects the planar array perpendicularly to the plane of the planar array.

3. The beam blanking device of claim 1, wherein the second deflection direction and the third deflection direction are substantially the same, and the first deflection direction is a mirror-image of the second deflection direction mirrored at the dividing plane.

4. The beam blanking device of claim 1, wherein the first deflection direction lies in a first deflection plane that is perpendicular to the plane of the planar array and that intersects the dividing plane, the second deflection direction lies in a second deflection plane that is perpendicular to the plane of the planar array and that intersects the dividing plane, and the third deflection direction lies in a third deflection plane that is perpendicular to the plane of the planar array and that intersects the dividing plane, wherein the first deflection plane, the second deflection plane, and the third deflection plane are substantially perpendicular to the dividing plane.

5. The beam blanking device of claim 1, comprising control circuitry connected to the first blanking electrode, to the second blanking electrode, and to the third blanking electrode, wherein the control circuitry is configured to put the first blanking electrode, the second blanking electrode, and the third blanking electrode to the same operating potential for generating the first electric field, the second electric field, and the third electric field, respectively.

6. The beam blanking device of claim 1, comprising a wafer, wherein the first blanking electrode, the second blanking electrode, the third blanking electrode, and the common electrode are formed on the wafer, wherein the wafer includes a first hole for allowing the first beamlet to pass through the first aperture, a second hole for allowing the second beamlet to pass through the second aperture, and a third hole for allowing the third beamlet to pass through the third aperture.

7. The beam blanking device of claim 6, wherein the common electrode forms a first shielding barrier extending parallel to the plane of the planar array between the first blanking electrode and the wafer, forms a second shielding barrier extending parallel to the plane of the planar array between the second blanking electrode and the wafer, and forms a third shielding barrier extending parallel to the plane of the planar array between the third blanking electrode and the wafer.

8. The beam blanking device of claim 1, wherein the first blanking electrode, the second blanking electrode, and the third blanking electrode are curved blanking electrodes that face away from the dividing plane or that face toward the dividing plane.

9. The beam blanking device of claim 1, wherein the beam blanking device includes m rows and n columns of blanking units, where m and n are larger than or equal to two, wherein the first blanking unit is arranged in a first row and a first column, the second blanking unit is arranged in a second row and in the first column, and the third blanking unit is arranged in the second row and in a second column, wherein the dividing plane separates each column into two half-columns, wherein blanking units within each column, or within each half-column, are configured for jointly deflecting beamlets passing therethrough, and wherein blanking units within each row are configured for individually deflecting the beamlets passing therethrough.

10. The beam blanking device according to claim 1, wherein at least one of a height of the first blanking electrode in a direction of an optical axis, a height of the second blanking electrode in the direction of the optical axis, and a height of the third blanking electrode in the direction of the optical axis is in a range from 100 µm to 1000 µm, and wherein a height of the common electrode in the direction of the optical axis is in a range from 200 µm to 3000 µm.

11. A beam blanking device for a multi-beamlet charged particle beam apparatus, comprising:
   a first blanking unit including a first blanking electrode and a first aperture;
   a second blanking unit including a second blanking electrode and a second aperture;
   a third blanking unit including a third blanking electrode and a third aperture; and
   a common electrode forming a first counter electrode for the first blanking electrode, a second counter electrode for the second blanking electrode and a third counter electrode for the third blanking electrode,
   wherein the first blanking unit, the second blanking unit and the third blanking unit are arranged in a planar array and define a plane of the planar array,
   wherein a dividing plane that intersects the planar array perpendicularly to the plane of the planar array separates the first blanking unit from the second blanking unit and the third blanking unit, and wherein a first line from a center of the first blanking electrode through a center of the first aperture, a second line from a center of the second blanking electrode through a center of the second aperture and a third line from a center of the third blanking electrode through a center of the third aperture either point away from the dividing plane or point toward the dividing plane, and wherein the common electrode shields the first, second and third blanking electrodes from above or from below or both from above and below.

12. The beam blanking device of claim 11, wherein the first line, the second line and the third line are substantially perpendicular to the dividing plane.

13. The beam blanking device of claim 11, wherein the center of the first blanking electrode is closer to the dividing plane than the center of the first aperture, the center of the second blanking electrode is closer to the dividing plane than the center of the second aperture, and the center of the third blanking electrode is closer to the dividing plane than the center of the third aperture.

14. The beam blanking device of claim 11, wherein the common electrode forms a cavity in which the first blanking electrode and the second blanking electrode are arranged, forms a cavity in which the third blanking electrode is arranged, and forms a shielding barrier between the second blanking electrode and the third blanking electrode.

15. The beam blanking device of claim 11, wherein a pitch between the center of the first aperture and the center of the second aperture is in a range from 100 µm to 500 µm, and a pitch between the center of the second aperture and the center of the third aperture is in a range from 100 µm to 500 µm.

16. The beam blanking device of claim 11, wherein the beam blanking device is a wafer-based beam blanking device.

17. A method of operating a beam blanking device of a multi-beamlet charged particle beam apparatus, wherein the beam blanking device comprises blanking units that share a common electrode and that are arranged in a planar array and define a plane of the planar array, the method comprising:

deflecting, with each of the blanking units, a beamlet of the multi-beamlet charged particle beam apparatus away from a dividing plane that intersects the planar array perpendicularly to the plane of the planar array and that separates the blanking units into a first group and into a second group, wherein, for each of the blanking units, the common electrode shields a blanking electrode of the respective blanking unit from above as viewed in an incoming direction of the beamlet or from below as viewed in a direction opposite to the incoming direction of the beamlet or both from above and below.

18. The method of claim 17, including putting the common electrode to a reference potential, wherein deflecting with each of the blanking units comprises putting each of the blanking units on the same operating potential different from the reference potential.

19. The method of claim 17, including putting the common electrode to a reference potential, wherein deflecting with each of the blanking units comprises putting the blanking units of the first group on a first operating potential, and putting the blanking units of the second group on a second operating potential, the first operating potential and the second operating potential being different from the reference potential and from each other.

20. The method of claim 17, wherein the blanking units include a first blanking unit, a second blanking unit, and a third blanking unit defining the plane of the planar array, wherein the first blanking unit includes a first blanking electrode and a first aperture, the second blanking unit includes a second blanking electrode and a second aperture, the third blanking unit includes a third blanking electrode and a third aperture, wherein the common electrode forms a first counter electrode for the first blanking electrode, a second counter electrode for the second blanking electrode and a third counter electrode for the third blanking electrode, wherein the dividing plane separates the first blanking unit from the second blanking unit and the third blanking unit, and wherein a first line from a center of the first blanking electrode through a center of the first aperture, a second line from a center of the second blanking electrode through a center of the second aperture and a third line from a center of the third blanking electrode through a center of the third aperture either point away from the dividing plane or point toward the dividing plane.

* * * * *